United States Patent [19]

Mao et al.

[11] Patent Number: 5,764,056
[45] Date of Patent: Jun. 9, 1998

[54] NICKEL-MANGANESE AS A PINNING LAYER IN SPIN VALVE/GMR MAGNETIC SENSORS

[75] Inventors: Sining Mao, Edina; Nurul Amin, Burnsville; Sunita B. Gangopadhyay, Bloomington; Edward S. Murdock, Edina, all of Minn.

[73] Assignee: Seagate Technology, Inc., Scotts Valley, Calif.

[21] Appl. No.: 645,645

[22] Filed: May 16, 1996

[51] Int. Cl.⁶ .......................... G01R 33/02; H01L 43/08; G11B 5/227; G11B 5/33
[52] U.S. Cl. .......................... 324/252; 338/32 R; 360/113
[58] Field of Search .......................... 324/252; 338/32 R; 360/113

[56] References Cited

U.S. PATENT DOCUMENTS

| | | | |
|---|---|---|---|
| 4,949,039 | 8/1990 | Grünberg | 324/252 |
| 5,315,468 | 5/1994 | Lin et al. | 360/113 |
| 5,422,571 | 6/1995 | Gurney et al. | 324/252 |

OTHER PUBLICATIONS

Devasahayam et al., "Exchange Biasing with NiMn," NSIC Meeting, Dec. 12, 1995.

Devasahayam et al., "Domain Stabilization With MR Heads," NSIC Heads Program Monthly Report, Feb. 14, 1996.

Devasahayam et al., "Exchange Biasing with NiMn," DSSC Spring '96 Review, Carnegie Mellon University.

Lin et al., "Improved Exchange Coupling Between Ferromagnetic Ni–Fe and Antiferromagnetic Ni–Mn–based Films," *Appl. Phys. Lett.*, vol. 65, No. 9, pp. 1183–1185, 29 Aug. 1994.

*Primary Examiner*—Walter E. Snow
*Attorney, Agent, or Firm*—Westman, Champlin & Kelly, P.A.

[57] ABSTRACT

A spin valve sensor and a method of fabricating the same are disclosed. The spin valve sensor includes a first layer of ferromagnetic material and a second layer of ferromagnetic material, with the second layer of ferromagnetic material having a thickness of less than about 100 Å. A first layer of non-ferromagnetic conducting material is positioned between the first and second layers of ferromagnetic material. A NiMn pinning layer is positioned adjacent to the second layer of ferromagnetic material such that the pinning layer is in contact with the second layer of ferromagnetic material, wherein the NiMn pinning layer has a thickness of less than about 200 Å and provides a pinning field for pinning a magnetization of the second layer of ferromagnetic material in a first direction.

23 Claims, 7 Drawing Sheets

NICKEL-MANGANESE AS A PINNING LAYER IN SPIN VALVE/GMR MAGNETIC SENSORS

BACKGROUND OF THE INVENTION

The present invention relates to spin valve sensors, and more particularly, to a spin valve sensor having nickel-manganese (NiMn) as a pinning layer.

Magnetic sensors utilizing the GMR effect, frequently referred to as "spin valve" sensors, are known in the art. A spin valve sensor is typically a sandwiched structure consisting of two ferromagnetic layers separated by a thin non-ferromagnetic layer. One of the ferromagnetic layers is called the "pinned layer" because it is magnetically pinned or oriented in a fixed and unchanging direction by an adjacent anti-ferromagnetic layer, commonly referred to as the "pinning layer," through anti-ferromagnetic exchange coupling. The other ferromagnetic layer is called the "free" or "unpinned" layer because the magnetization is allowed to rotate in response to the presence of external magnetic fields.

The benefits of spin valve sensors result from the large change of conductance exhibited by the devices, which depends on the relative alignment between the magnetizations of the two ferromagnetic layers. In order to function effectively, a sufficient pinning field from the pinning layer is required to keep the pinned ferromagnetic layer's magnetization unchanged during operation of the GMR sensor. Thus far, various anti-ferromagnetic materials, such as FeMn, NiO, IrMn, PtPdMn, and TbCo, have been used as pinning layers for spin valve sensors. However, these materials have provided less than desirable results. For example, for FeMn pinning layers, the temperature (referred to as the blocking temperature) at which the pinning field disappears (or is greatly reduced) is very close to the typical sensor operating temperature of 100° C.–150° C. Therefore, at normal operating temperatures, an FeMn pinning layer typically does not provide a pinning field of sufficient strength to prevent the magnetization of the pinned ferromagnetic layer from rotating in the presence of an external magnetic field. Without sufficient pinning strength, the spin valve cannot function to its full potential. Further, materials such as FeMn and TbCo are susceptible to corrosion. Also, oxide materials such as NiO, which provide a low pinning field as well, are difficult to process. IrMn and PtPdMn are both expensive materials which provide pinning field strengths which are lower than is desired at normal operating temperatures.

It is known in the art that NiMn has properties which make it desirable for use as an exchange bias layer material to stabilize magnetic sensors. See for example, Lin et al., "Improved Exchange Coupling Between Ferromagnetic Ni-Fe and Antiferromagnetic Ni-Mn-based Films," Appl. Phys. Lett., Vol. 65, No. 9, pp. 1183–1185, 29 Aug. 1994. See, Lin et al., U.S. Pat. No. 5,315,468 entitled "Magnetoresistive Sensor Having Antiferromagnetic Layer for Exchange Bias." These references discuss the use of NiMn as an exchange bias layer material to stabilize the MR sensor layer. However, the exchange fields must be kept low to avoid pinning the sensor layer, which would drastically reduce its sensitivity. NiMn is capable of providing high exchange fields at temperatures far in excess of the pinning layer materials mentioned above. In addition to its ability to provide thermally stable exchange fields of high magnitude, NiMn is very corrosion-resistant. As taught by Lin et al., a NiMn layer having a thickness of around 500 Å can be used as an exchange bias layer adjacent to the MR sensor layer in a conventional MR sensor. However, the thicknesses and structure required for the MR sensor of Lin et al. are not compatible with necessary spin valve sensor thicknesses and structures.

A problem with using NiMn as a pinning layer material in a spin valve sensor is that, as is well-known in the art, heating a spin valve sensor to temperatures greater than 225° C.–240° C. for more than 2–3 hours has resulted in inter-diffusion of the various layers and thus in destruction of the sensor. However, high annealing temperatures are necessary in order to realize the high pinning fields desired from the NiMn. The inter-diffusion between the layers during high temperature annealing has been an obstacle to using NiMn as a pinning layer in spin valve sensors. See for example, Devasahayam et al., "Exchange Biasing with NiMn," DSSC Spring '96 Review, Carnegie Mellon University.

Attempts in the prior art to create a spin valve sensor having NiMn as a pinning layer have failed. For example, Devasahayam et al. describe one such failed attempt in which the NiMn pinning layer is pre-annealed prior to depositing the NiFe ferromagnetic layer of the spin valve sensor. Devasahayam et al. describe another attempt to use NiMn as a pinning layer material in a spin valve sensor in which a bi-layer of NiMn and NiFe are pre-annealed. Next, the layer of NiFe is sputter etched away, and a new NiFe ferromagnetic layer is deposited on top of the NiMn pinning layer. While some success was reported in this second attempted method, the device reported by Devasahayam et al. requires a NiFe ferromagnetic layer thickness of 250 Å and a NiMn pinning layer thickness of 500 Å, while achieving a pinning field of only 100 Oe. Thus, in addition to providing insufficient pinning strengths, the thicknesses of the layers required by Devasahayam et al. are incompatible with spin valve sensor requirements. Further, the process of annealing and sputter etching the layer of NiFe and redepositing the layer of Nife is not practical for use in producing spin valve sensors. Therefore, there is a need for a spin valve sensor with thermally stable high pinning fields.

SUMMARY OF THE INVENTION

A spin valve sensor and a method of fabricating the same are disclosed. The spin valve sensor includes a first layer of ferromagnetic material and a second layer of ferromagnetic material, with the second layer of ferromagnetic material having a thickness of less than about 100 Å. A first layer of non-ferromagnetic conducting material is positioned between the first and second layers of ferromagnetic material. A NiMn pinning layer is positioned adjacent to the second layer of ferromagnetic material such that the pinning layer is in contact with the second layer of ferromagnetic material, wherein the NiMn pinning layer has a thickness of less than about 200 Å and provides a pinning field for pinning a magnetization of the second layer of ferromagnetic material in a first direction.

DETAILED DESCRIPTION OF THE PREFERRED EMBODIMENTS

Figure 1:
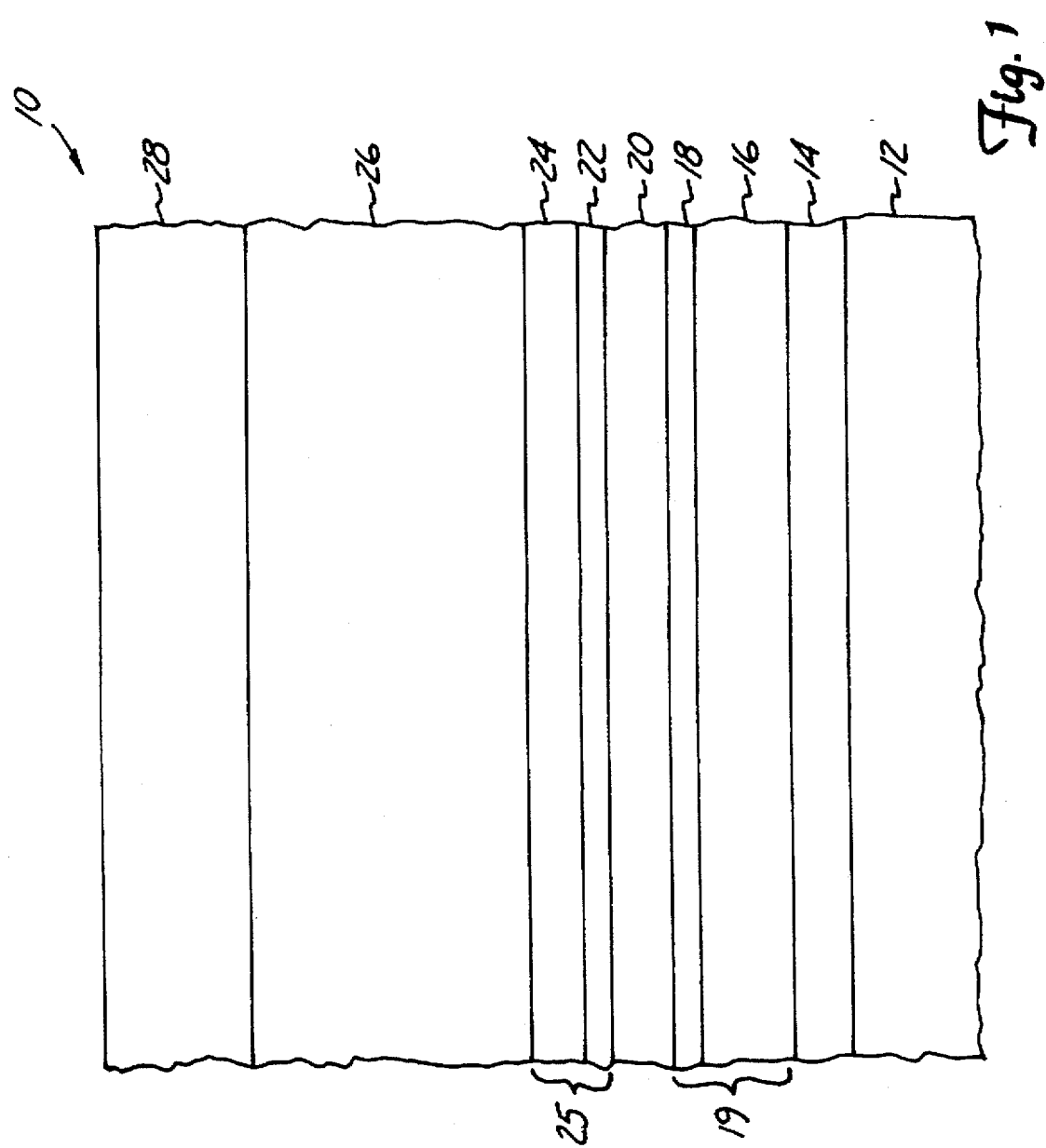
FIG. 1 is a diagrammatic view of a spin valve sensor stack which illustrates the various layers of the sensor in accordance with a first embodiment of the present invention.

FIG. 1 is a diagrammatic view illustrating a first preferred embodiment of a spin valve sensor stack (hereafter referenced to as a spin valve sensor) in accordance with the present invention. It must be noted that the spin valve sensors illustrated in the Figures represent only the spin valve sensor stack, and that other layers and features can be added to the spin valve sensor stacks as desired. Spin valve sensor 10 includes substrate 12, buffer or seed layer 14, unpinned or free ferromagnetic layer 19, non-ferromagnetic layer 20, pinned ferromagnetic layer 25, NiMn pinning layer 26 and cap layer 28. In the embodiment illustrated in FIG. 1, the layers of spin valve 10 are preferably as follows. Substrate 12 is preferably a layer of $Al_2O_3$ or other insulating gap material. Buffer layer 14 is preferably a layer of tantalum (Ta) having a thickness of approximately 35 Å. However, buffer layer 14 can be any of a variety of materials and thicknesses capable of establishing the desired crystallographic and magnetic orientation of unpinned ferromagnetic layer 19. Unpinned ferromagnetic layer 19 is preferably a bi-layered structure having layer 16 of nickel-iron (NiFe) and layer 18 of cobalt (Co). In the preferred embodiment illustrated, layer 16 of NiFe is approximately 50 Å thick, while layer 18 of Co is approximately 10 Å thick. However, in other embodiments, unpinned ferromagnetic layer 19 can be a ferromagnetic layer having one or more layers of other known ferromagnetic materials of varying thicknesses. Non-ferromagnetic layer 20 is preferably a layer of copper (Cu) having a thickness of approximately 33 Å and being in contact with layer 20 of Co. However, other non-ferromagnetic conducting materials and thicknesses can be used instead. Pinned ferromagnetic layer 25 is also preferably a bi-layered structure having layer 22 of Co and layer 24 of NiFe, with layer 22 of Co being positioned in contact with non-ferromagnetic layer 20. Layer 22 of Co preferably has a thickness of approximately 10 Å, while layer 24 of NiFe preferably has a thickness of approximately 25 Å. NiMn pinning layer 26 preferably has a composition of between about 45 and 55 atomic percent Mn and has a thickness of between about 80 Å and 200 Å. In the preferred embodiment illustrated in FIG. 1, NiMn pinning layer 26 has a thickness of approximately 150 Å. Cap layer 28 is preferably a layer of Ta having a thickness of approximately 80 Å. Cap layer 28 maintains the integrity of the structure during subsequent processing.

Figure 2:
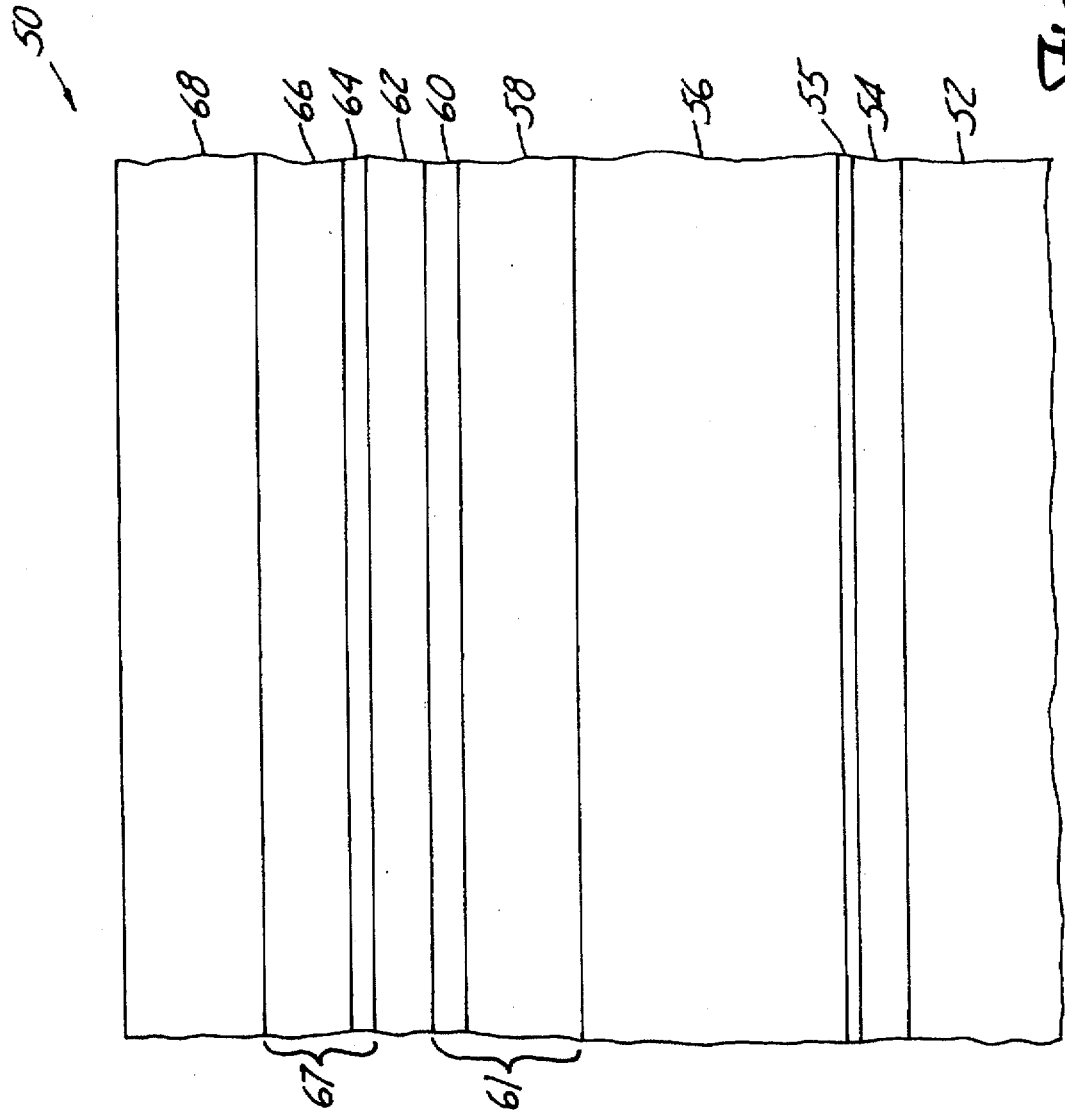
FIG. 2 is a diagrammatic view of a spin valve sensor stack which illustrates the various layers of the sensor in accordance with a second embodiment of the present invention.

FIG. 2 is a diagrammatic illustration of a second embodiment of a spin valve sensor or sensor stack in accordance with the present invention. spin valve sensor 50 shown in FIG. 2 includes substrate 52, buffer layer 54, seed layer 55, NiMn pinning layer 56, pinned ferromagnetic layer 61, non-ferromagnetic conducting layer 62, unpinned ferromagnetic layer 67 and cap layer 68. spin valve sensor 50 illustrated in FIG. 2 is the same as spin valve sensor 10 illustrated in FIG. 1 in most respects. Substrate 52 is again preferably a layer of $Al_2O_3$ or other insulating gap material. Buffer layer 54 and cap layer 68 are again preferably layers of Ta having thicknesses of approximately 35 Å and 80 Å, respectively. Pinned ferromagnetic layer 61 is once again preferably a bi-layered structure which includes layer 58 of NiFe and layer 60 of Co. Layers 58 and 60 preferably have thicknesses of approximately 25 Å and 10 Å, respectively. Non-ferromagnetic layer 62 is again preferably a layer of Cu having a thickness of about 33 Å. Unpinned ferromagnetic layer 67 is also preferably a bi-layered structure which includes layer 64 of Co and layer 66 of NiFe. Layers 64 and 66 preferably have thicknesses of about 10 Å and 50 Å, respectively. As is clear from the above discussion, the thicknesses of the various layers of spin valve 50 illustrated in FIG. 2 are preferably the same as the thicknesses of the corresponding layers of spin valve 10 illustrated in FIG. 1. Consequently, NiMn pinning layer 56 once again preferably has a thickness of between about 80 Å and 200 Å. Seed layer 55 is preferably a layer of NiFe which promotes the desired crystallographic orientation of the NiMn.

The primary difference between spin valve sensor 60 illustrated in FIG. 2 and spin valve sensor 10 illustrated in FIG. 1 is that pinned ferromagnetic layer 61 is below unpinned ferromagnetic layer 67. This requires that pinned ferromagnetic layer 61 be deposited prior to deposition of unpinned ferromagnetic layer 67, and that NiMn pinning layer 56 be deposited prior to deposition of pinned ferromagnetic layer 61. Thus, pinned ferromagnetic layer 61 is on top of NiMn pinning layer 56 instead of vice versa. Otherwise, spin valve sensors 50 and 10 are substantially the same. Therefore, as was the case with spin valve sensor 10 illustrated in FIG. 1, the various layers other than NiMn pinning layer 56 can utilize a large number of substitute materials and thicknesses in place of the preferred materials and thicknesses specified above.

Figure 3:
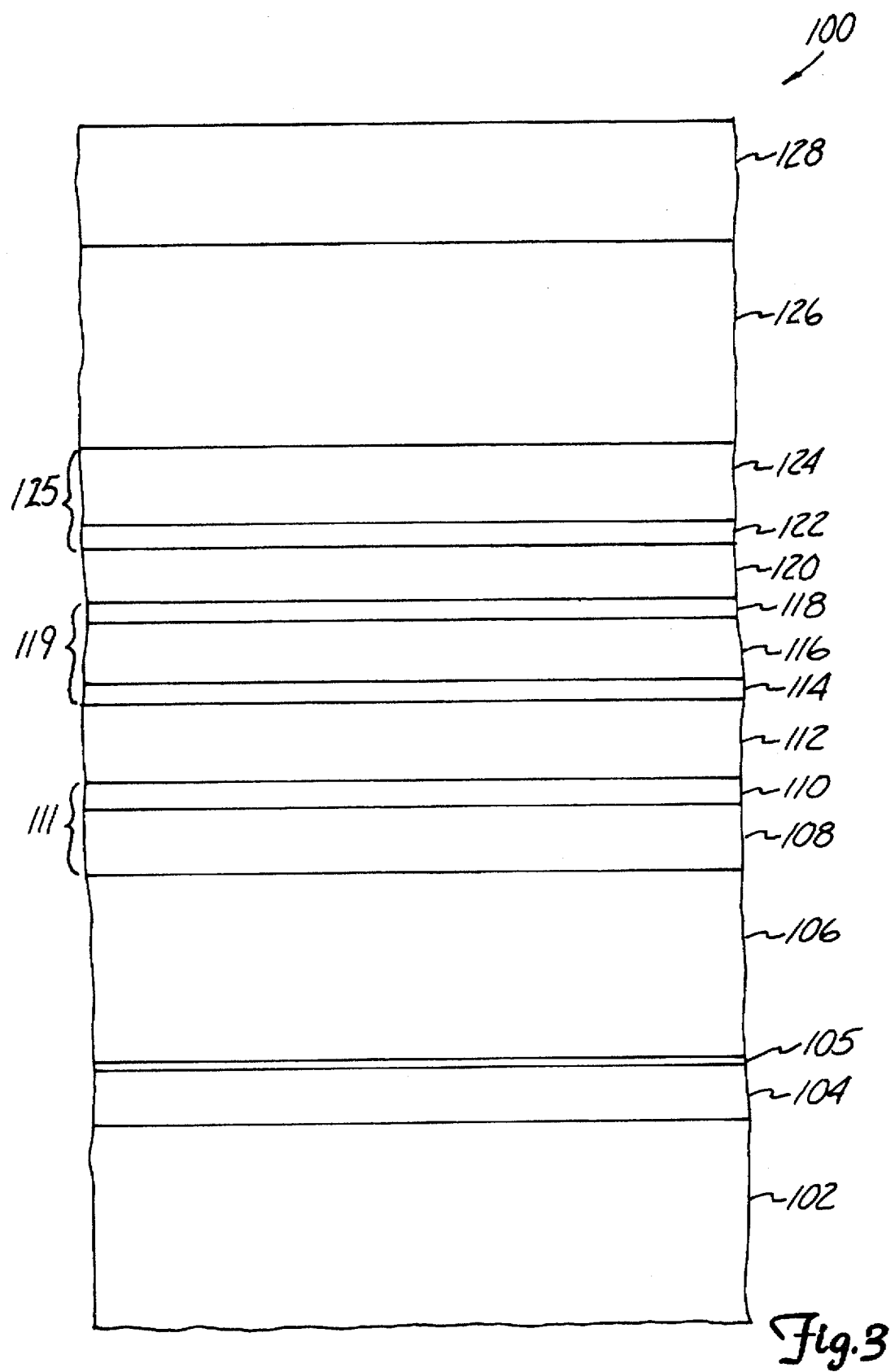
FIG. 3 is a diagrammatic view of a spin valve sensor stack which illustrates the various layers of the sensor in accordance with a third embodiment of the present invention.

FIG. 3 illustrates a third embodiment of a spin valve sensor in accordance with the present invention. Spin valve sensor 100 illustrated in FIG. 3 is substantially the same as spin valve sensors 10 and 50 illustrated in FIGS. 1 and 2 in that it utilizes the same or similar types of layers in general, and more specifically, in that it utilizes NiMn as a pinning layer material. The materials and thicknesses of the various layers are also very similar. spin valve sensor 100 differs from spin valve sensors 10 and 50 in that it includes additional or repeated layers in order to further enhance the spin valve effect. To this end, spin valve sensor 100 includes substrate 102, buffer layer 104, seed layer 105, first NiMn pinning layer 106, first pinned ferromagnetic layer 111, first non-ferromagnetic conducting layer 112, unpinned ferromagnetic layer 119, second non-ferromagnetic conducting layer 120, second pinned ferromagnetic layer 125, second NiMn pinning layer 126 and cap layer 128. First and second pinned ferromagnetic layers 111 and 125 are each preferably bi-layered structures similar to those discussed with reference to sensor stacks 10 and 50. First pinned ferromagnetic layer 111 preferably includes layer 110 of Co having a thickness of approximately 10 Å and layer 108 of NiFe having a thickness of approximately 25 Å. Second pinned ferromagnetic layer 125 preferably includes layer 122 of Co having a thickness of approximately 10 Å, and layer 124 of NiFe having a thickness of approximately 25 Å. To facilitate the two unpinned ferromagnetic layers and the two non-ferromagnetic layers, unpinned ferromagnetic layer 119 is preferably a tri-layered structure which includes layer 116 of NiFe having a thickness of approximately 50 Å sandwiched between layers 114 and 118 of Co having thicknesses of approximately 10 Å each. Each of NiMn pinning layers 106 and 126 has a thickness of between about 80 Å and 200 Å. Preferably, each of NiMn pinning layers 106 and 126 has a thickness of about 150 Å. Non-ferromagnetic conducting layers 112 and 120 are preferably layers of Cu having thicknesses of approximately 33 Å.

Figure 4:
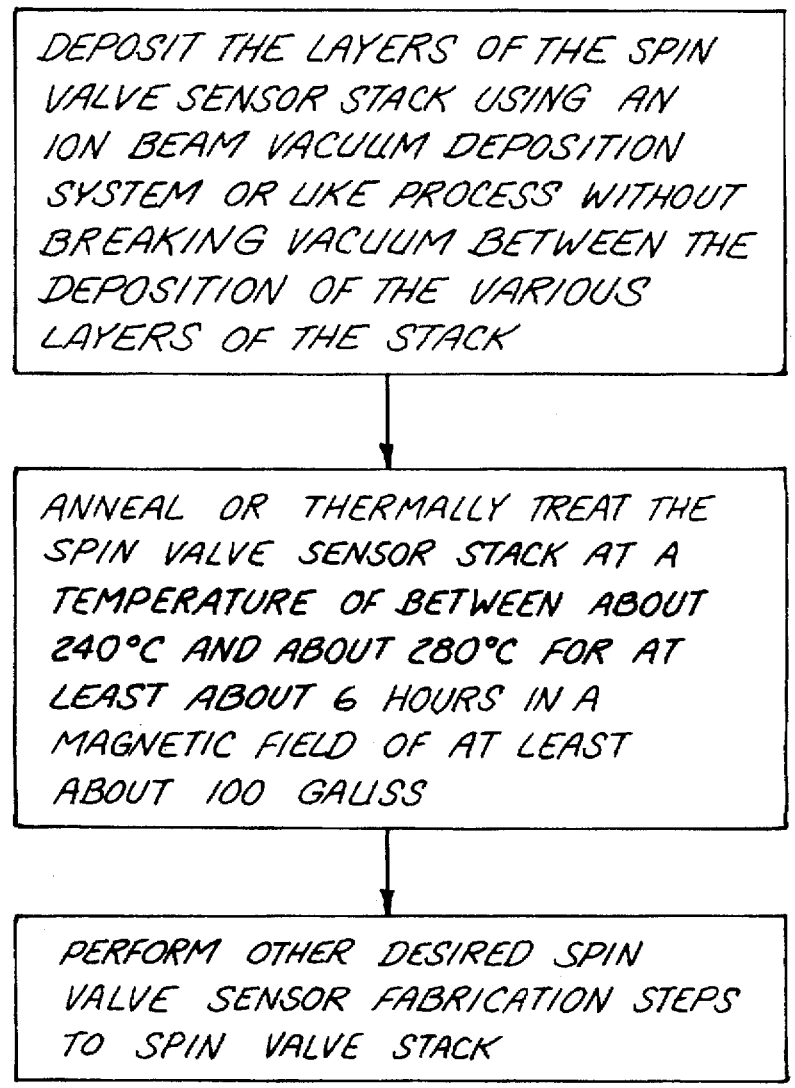
FIG. 4 is a flow diagram illustrating a preferred method of fabricating the NiMn pinned spin valve sensors of the present invention.

In accordance with preferred methods of the present invention, spin valve sensors 10, 50 and 100 are fabricated as illustrated in the flow diagram of FIG. 4 and as discussed below. First, all of the various layers of the spin valve sensors described above are preferably deposited using an ion beam vacuum deposition system or a like process. Deposition of each layer occurs sequentially, without breaking vacuum in between the deposition of various layers. The ion beam deposition voltages can range from between 200–1000 volts. The preferred deposition rate is between 0.25 Å/sec. and 2 Å/sec. The ion beam sputtering deposition is performed in the presence of an inert gas, preferably at a low pressure of approximately $10^{-4}$ Torr. Deposition temperature does not appear to be important. Although deposition in an ion beam vacuum deposition system is preferred, the present invention is not limited to spin valve sensors fabricated in ion beam systems. For example, the spin valve sensor stack can be deposited using other thin film techniques such as rf/dc sputtering and MBE.

Next, the multi-layered sensor stacks illustrated in FIGS. 1–3 are annealed at a temperature of between approximately 240°–280° C. for at least about 6 hours. In preferred embodiments, the layers are annealed at 260° C. for 15 hours. The annealing is preferably performed in a magnetic field of at least 100 gauss. The strength of the magnetic field used ultimately depends upon the shape of the sensor being fabricated. In general, higher annealing magnetic field strengths are preferred. The annealing process is necessary to cause the NiMn pinning layers to produce the high pinning field strengths desired. Prior to annealing, the NiMn pinning layers do not produce the necessary pinning fields. It is believed that ion beam deposition of the layers of the spin valve sensor of the present invention results in the production of fewer grain boundaries. This in turn is believed to provide thermal stability which allows the spin valve sensor to be annealed under conditions which have proven destructive to prior art spin valve sensor designs. Therefore, ion beam deposition is currently the preferred method of depositing the layers of the spin valve sensors of the present invention.

The appearance of pinning fields is associated with the phase transformation in the NiMn film as confirmed by X-ray diffractometry. Specifically, it is associated with the transformation from face-centered-cubic (fcc) γ phase to the anti-ferromagnetic fct θ phase. A pinning field of between 400 and 700 Oe is readily obtainable using the preferred method of the present invention.

After annealing, spin valve sensor stacks illustrated in FIGS. 1–3 are completed. Of course, other spin valve fabrication process steps which are not related to the NiMn pinning layer, and which are well-known in the art, must be performed in order to completely fabricate the spin valve sensors. These additional steps must be tailored to specific spin valve sensor designs, and are therefore not discussed.

Figure 5B:
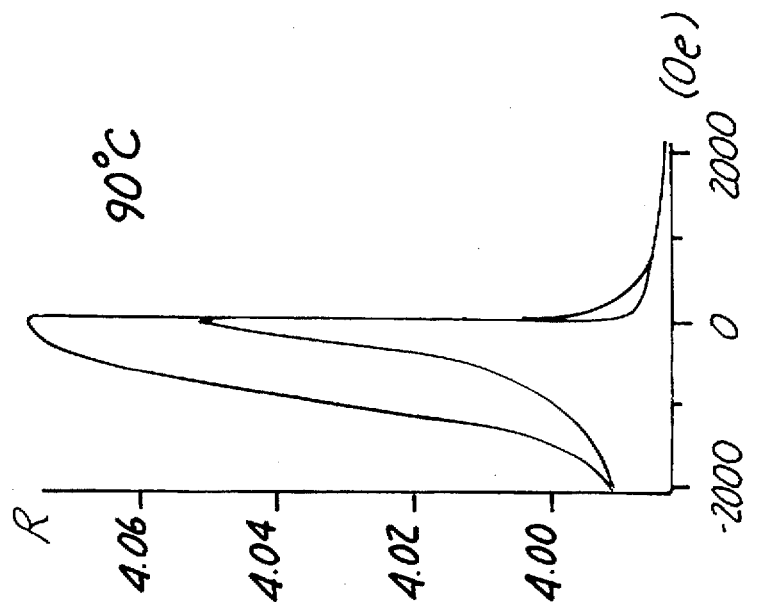
FIGS. 5A–5D are plots illustrating the thermal stability and reliability of the spin valve sensors of the present invention.
Figure 5A:
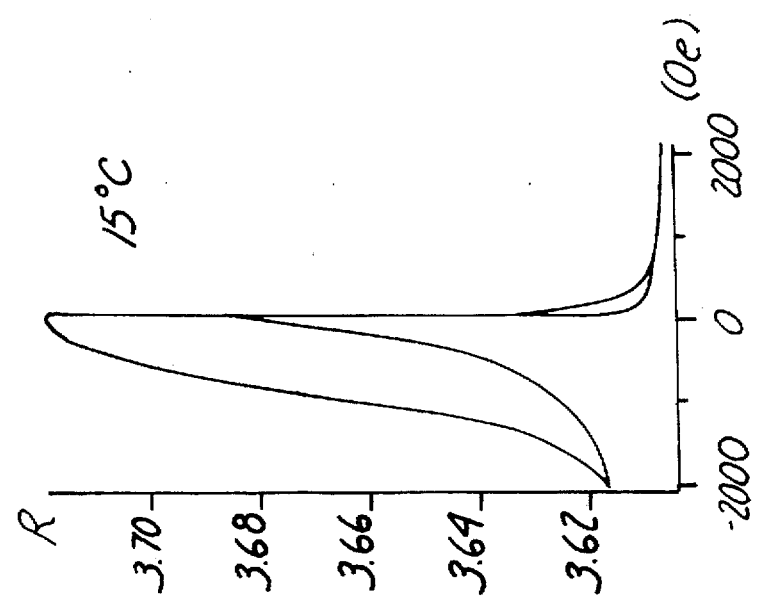
Figure 5D:
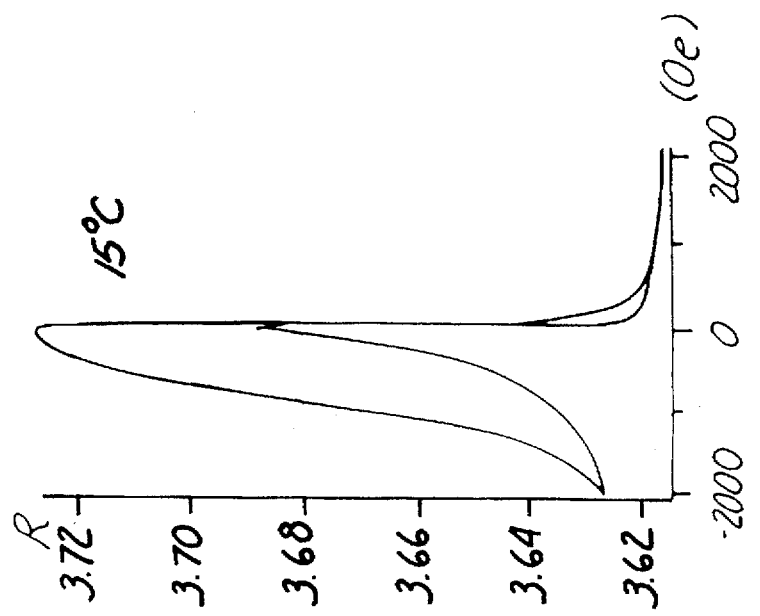
Figure 5C:
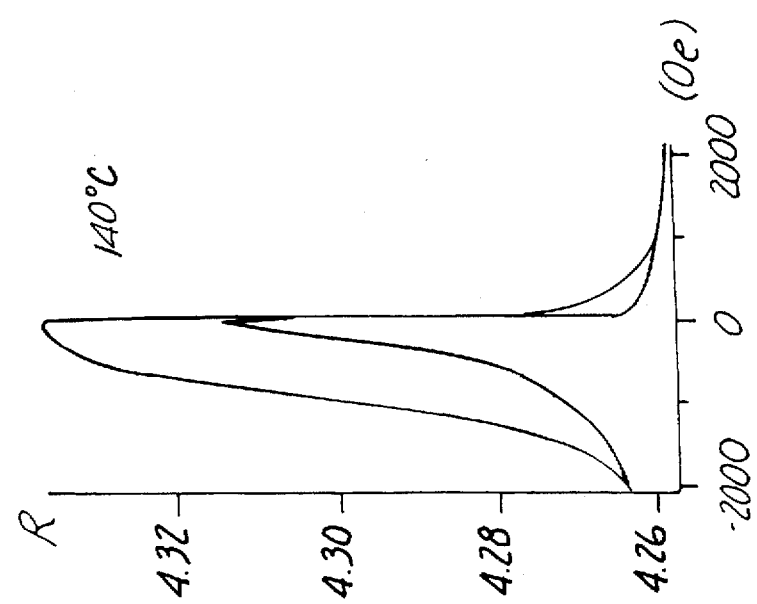

FIGS. 5A–5D are plots illustrating the sheet resistance in ohms of the NiMn pinned spin valve sensors of the present invention over a range of applied magnetic field strengths at various operating temperatures. The plots illustrate the sheet resistance of the spin valve sensors between external applied magnetic fields of −2000 Oe and 2000 Oe. FIG. 5A illustrates the sheet resistance at a temperature of 15° C. FIG. 5B illustrates the sheet resistance at a temperature of 90° C. FIG. 5C illustrates the sheet resistance at a temperature of 140° C. FIG. 5D illustrates the sheet resistance at 15° C. after the spin valve sensor has cooled from a temperature of 180° C. As can be seen from FIGS. 5A–5D, the spin valve sensors of the present invention exhibit thermal stability during use in that the sheet resistance curves maintain their general characteristics from room temperature to temperatures beyond normal operating temperatures. This lack of temperature dependence is desirable.

A comparison of FIGS. 5A and 5D further illustrates that the spin valve sensors of the present invention exhibit thermal reliability in that they can be heated to normal operating temperatures and cooled back down to room temperature without any significant change in the sheet resistance. This type of thermal reliability is a problem with some spin valve sensor designs. Finally, the highly advantageous results illustrated in FIGS. 5A–5D also demonstrate that no irreversible damage occurred to the spin valve sensors of the present invention during fabrication. This is contrary to prior art attempts to use NiMn as a pinning layer material in a spin valve sensor. In these prior art attempts, the necessary high annealing temperatures irreversibly damaged the spin valve sensors.

Figure 6:
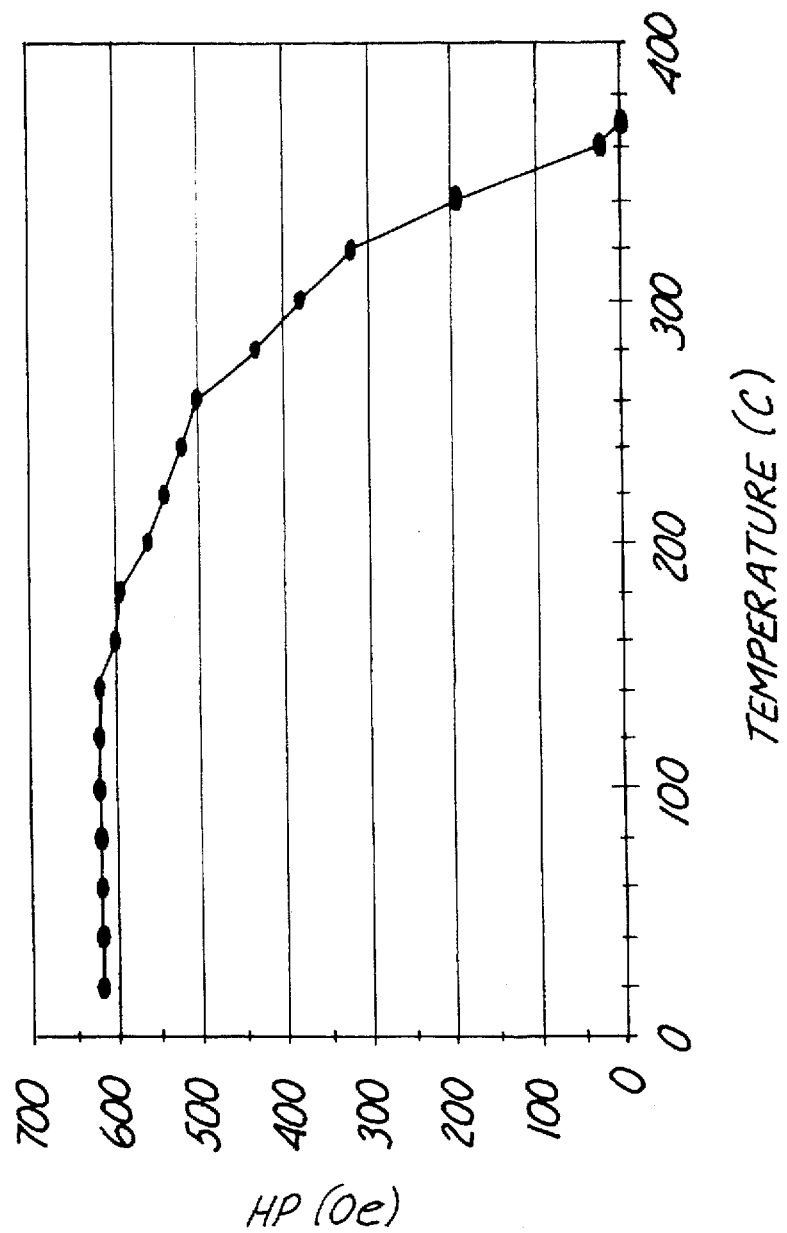
FIG. 6 is a plot illustrating the thermal stability of the pinning field strength provided by the NiMn pinning layers in the spin valve sensors of the present invention.

FIG. 6 is a plot illustrating the strength of pinning field $H_P$ provided by the NiMn pinning layer of a spin valve sensor of the present invention. The spin valve sensor represented by the data of FIG. 6 uses a 200 Å NiMn pinning layer, 25 Å NiFe ferromagnetic layers, and a 15 Å Co layer. As can be seen from the plot of FIG. 6, pinning field $H_P$ provided by the NiMn pinning layer has a strength of more than 600 Oe up to operating temperatures of approximately 200° C. This is a significant improvement over conventional spin valve sensor pinning materials which frequently exhibited an adverse temperature dependence and provided pinning fields of only approximately 200 Oe or less at temperatures of 120°–140° C. Therefore, it is clear from the plot of FIG. 6 that the NiMn pinned spin valve sensors of the present invention provide greatly increased pinning field strengths which show no significant thermal dependence well past normal operating temperatures.

Although the present invention has been described with reference to preferred embodiments, workers skilled in the art will recognize that changes may be made in form and detail without departing from the spirit and scope of the invention.

What is claimed is:

1. A spin valve sensor comprising:
   a first layer of ferromagnetic material;
   a second layer of ferromagnetic material;
   a first layer of non-ferromagnetic material positioned between the first and second layers of ferromagnetic material; and
   an NiMn pinning layer positioned adjacent to the second layer of ferromagnetic material such that the NiMn pinning layer is in contact with the second layer of ferromagnetic material, wherein the NiMn pinning layer has a thickness of less than about 200 Å.

2. The spin valve sensor of claim 1, wherein the thickness of the NiMn pinning layer is also greater than about 80 Å.

3. The spin valve sensor of claim 2, wherein the thickness of the NiMn pinning layer is about 150 Å.

4. The spin valve sensor of claim 1, wherein the second layer of ferromagnetic material includes a layer of NiFe having a thickness of less than about 50 Å.

5. The spin valve sensor of claim 4, wherein the second layer of ferromagnetic material includes a layer of NiFe having a thickness of about 30 Å.

6. The spin valve sensor of claim 1, wherein the second layer of ferromagnetic material is a multi-layer stack of ferromagnetic materials, the multi-layer stack of ferromagnetic materials having a thickness of less than about 60 Å.

7. The spin valve sensor of claim 6, wherein the second layer of ferromagnetic material is a multi-layer stack of ferromagnetic materials which includes a layer of NiFe having a thickness of about 25 Å and a layer of Co having a thickness of about 10 Å.

8. The spin valve sensor of claim 1, wherein the NiMn pinning layer is positioned on top of the second layer of ferromagnetic material, and wherein the NiMn pinning layer being positioned on top of the second layer of ferromagnetic material requires that the NiMn pinning layer have been deposited after deposition of the second layer of ferromagnetic material.

9. The spin valve sensor of claim 1, wherein the NiMn pinning layer provides a pinning field for pinning a magnetization of the second layer of ferromagnetic material in a first direction, wherein the pinning field provided by the NiMn pinning layer has a strength which is substantially constant at temperatures up to at least about 140° C.

10. The spin valve sensor of claim 9, wherein the strength of the pinning field provided by the NiMn pinning layer is substantially constant between temperatures of about 15° C. and temperatures of at least about 140° C.

11. The spin valve sensor of claim 9, wherein the NiMn pinning layer has a pinning field strength of at least about 400 Oe at a temperature of approximately 120° C.

12. The spin valve sensor of claim 11, wherein the NiMn pinning layer has a pinning field strength of at least about 500 Oe at a temperature of at least about 140° C.

13. The spin valve sensor of claim 1, wherein the NiMn pinning layer is an ion beam deposited NiMn pinning layer.

14. The spin valve sensor of claim 1, wherein the first layer of non-ferromagnetic material is a layer of Cu.

15. A spin valve sensor comprising:
   a first layer of ferromagnetic material;
   a second layer of ferromagnetic material having a thickness of less than about 100 Å;
   a first layer of non-ferromagnetic conducting material positioned between the first and second layers of ferromagnetic material;
   a pinning layer positioned on top of the second layer of ferromagnetic material such that the pinning layer is in contact with the second layer of ferromagnetic material, wherein the pinning layer is a layer of NiMn having a thickness of less than about 200 Å and which provides a pinning field for pinning a magnetization of the second layer of ferromagnetic material in a first direction, wherein being positioned on top of the second layer of ferromagnetic material requires that the pinning layer have been deposited subsequent to deposition of the second layer of ferromagnetic material.

16. The spin valve sensor of claim 15, wherein the pinning field provided by the pinning layer has a strength of at least about 400 Oe at a temperature of at least about 120° C.

17. The spin valve sensor of claim 16, wherein the pinning field provided by the pinning layer has a strength of at least about 600 Oe at a temperature of at least about 140° C.

18. The spin valve sensor of claim 17, wherein the pinning layer is an ion beam deposited pinning layer.

19. The spin valve sensor of claim 18, wherein the thickness of the layer of NiMn is greater than about 80 Å.

20. The spin valve sensor of claim 19, wherein the thickness of the layer of NiMn is about 150 Å.

21. The spin valve sensor of claim 20, wherein the first layer of ferromagnetic material has a thickness of less than about 80 Å, and wherein the second layer of ferromagnetic material has a thickness of less than about 50 Å.

22. The spin valve sensor of claim 21, wherein at least one of the first and second layers of ferromagnetic material comprise a multi-layer stack which includes a layer of NiFe and a layer of Co.

23. The spin valve sensor of claim 1, wherein the nickel-manganese pinning layer is in a crystallographic phase having a face-centered-tetragonal configuration.

* * * * *